United States Patent [19]
Lumpp et al.

[11] Patent Number: 5,584,956
[45] Date of Patent: Dec. 17, 1996

[54] METHOD FOR PRODUCING CONDUCTIVE OR INSULATING FEEDTHROUGHS IN A SUBSTRATE

[75] Inventors: Janet K. Lumpp, Coralville, Iowa; Susan D. Allen, New Orleans, La.

[73] Assignee: University of Iowa Research Foundation, Iowa City, Iowa

[21] Appl. No.: 240,206

[22] Filed: May 9, 1994

Related U.S. Application Data

[63] Continuation of Ser. No. 987,783, Dec. 9, 1992, abandoned.

[51] Int. Cl.$^6$ .................... B32B 31/28; H01K 3/10; B05D 5/12
[52] U.S. Cl. ............ 156/272.8; 156/247; 156/253; 29/846; 29/850; 29/852; 427/97; 427/124
[58] Field of Search .................... 156/631, 644, 156/151, 247, 253, 272.8, 273.9, 275.7, 382; 29/846, 850, 852; 427/97, 99, 124; 219/121.7, 121.71, 121.22

[56] References Cited

U.S. PATENT DOCUMENTS

| | | | |
|---|---|---|---|
| 3,562,009 | 2/1971 | Cranston et al. | 219/121.71 X |
| 3,691,632 | 9/1972 | Smith | 156/632 X |
| 3,873,756 | 3/1975 | Gall et al. | 427/97 X |
| 3,984,598 | 10/1976 | Sarazin et al. | 156/272.2 X |

(List continued on next page.)

FOREIGN PATENT DOCUMENTS

| | | | |
|---|---|---|---|
| 0176931 | 10/1983 | Japan | 437/173 |
| 2-66954 | 3/1990 | Japan | 156/272.8 |
| 4-28490 | 1/1992 | Japan | 219/121.7 |
| 5-200574 | 8/1993 | Japan | 219/121.7 |
| 9001374 | 2/1990 | WIPO | 156/644 |

OTHER PUBLICATIONS

"Laser drilled holes in fired ceramics," F. F. Fugardi et al. IBM Technical Disclosure Bulletin, vol. 14, Mar. 1972.
"Machining of Advanced Ceramics", Laurel M. Sheppard, pp. 40–43; 46–48; *Advanced Materials and Processes Inc. Metal Progress*, Dec. 1987.
"A Study of Pulsed Laser Planarization of Aluminum for VLSI Metallization", pp. 329–335; R. Liu, et al., Jun. 12–13m 1989 VMIC Conference.
"Feature size and temperature sensitive process windows for excimer laser planarization of aluminum", R. Baseman pp. 84–90; J.Vac.Sci. Technol.B8 (1), Jan./Feb. 1990.

(List continued on next page.)

*Primary Examiner*—David A. Simmons
*Assistant Examiner*—M. Curtis Mayes
*Attorney, Agent, or Firm*—Fleshner & McConathy PLLC

[57] ABSTRACT

A method for producing feedthroughs in a substrate having a front and back surface, wherein the substrate either has a hole or absorbs radiation at a given wavelength. The method includes selecting and intimately bonding a sheet to the back surface of the substrate with an adhesive which is absorptive at the given wavelength. If the substrate has a hole, an exposed area of the sheet is illuminated with laser radiation at the given wavelength and at a power level sufficient to ablate a portion of the sheet behind the exposed area, thereby creating the feedthrough in the substrate. If the substrate has no hole, an area on the front surface of the substrate is illuminated with laser radiation at the given wavelength and at a power level sufficient to ablate a portion of the substrate and a portion of the sheet behind the area, thereby creating the feedthrough in the substrate. The sheet can then be removed from the substrate. Alternatively, if the sheet is conductive, the sheet can remain bonded to the substrate and can serve as a ground plane for the substrate. If the sheet is an insulator, the feedthrough is an insulated feedthrough and if the sheet is conductive, the feedthrough is a conductive feedthrough. This procedure can be extended to produce a two conductor feedthrough.

12 Claims, 10 Drawing Sheets

U.S. PATENT DOCUMENTS

| | | | |
|---|---|---|---|
| 4,115,683 | 9/1978 | Clark et al. | 219/121.7 |
| 4,412,687 | 11/1983 | Andre | 280/610 |
| 4,568,413 | 2/1986 | Toth et al. | 427/99 X |
| 4,684,781 | 8/1987 | Frish et al. | 427/554 X |
| 4,720,401 | 1/1988 | Ho et al. | 427/124 X |
| 4,959,119 | 9/1990 | Lantzer | 156/644 |
| 5,011,761 | 4/1991 | Cagnin et al. | 205/135 X |
| 5,012,067 | 4/1991 | Sato et al. | 219/121.72 |
| 5,073,687 | 12/1991 | Inagawa et al. | 219/121.7 |
| 5,084,345 | 1/1992 | Manos | 156/331.1 X |
| 5,173,441 | 12/1992 | Yu et al. | 437/173 |
| 5,211,805 | 5/1993 | Srinivasan | 156/643 |

OTHER PUBLICATIONS

"High–Aspect–Ratio Via–Hole Filling with Aluminum Melting by Excimer Laser Irradiation for Multilevel Interconnection"; IEEE Electron Device Ltrs., vol. EDL8, #2, Feb. 1987.

"Eximer Laser Etching of Aluminum Nitride", Lumpp et al, pp. 353–358; Proc. Oct. 1991, International Symposium of Micro–Electronics.

"Superconducting Wires", Lanagan et al., pp. 305–312; Journal of Less Common Metals, vol. 149 (1989).

L. L. Chase et al., "Laser Ablation and Optical Surface Damage", pp. 193–201, *Laser Ablation Mechanisms and Applications*, Ed. J. C. Miller et al., Lecture Notes in Physics 389, Springer–Verlag, New York, 1991.

J. H. Brannon, "Excimer–Laser Ablation and Etching," IEEE Circuits and Devices, Sep. 1990, pp. 18–24.

Tam et al., "Picosecond laser sputtering of sapphire at 266 nm," Applied Physics Letters 55 [20]2045–7 (1989).

Rothenberg et al., "Laser Sputtering. Part II. The Mechanism of the Sputtering of $Al_2O_3$," Nuclear Instruments and Methods in Physics Research, B1 291–300 (1984).

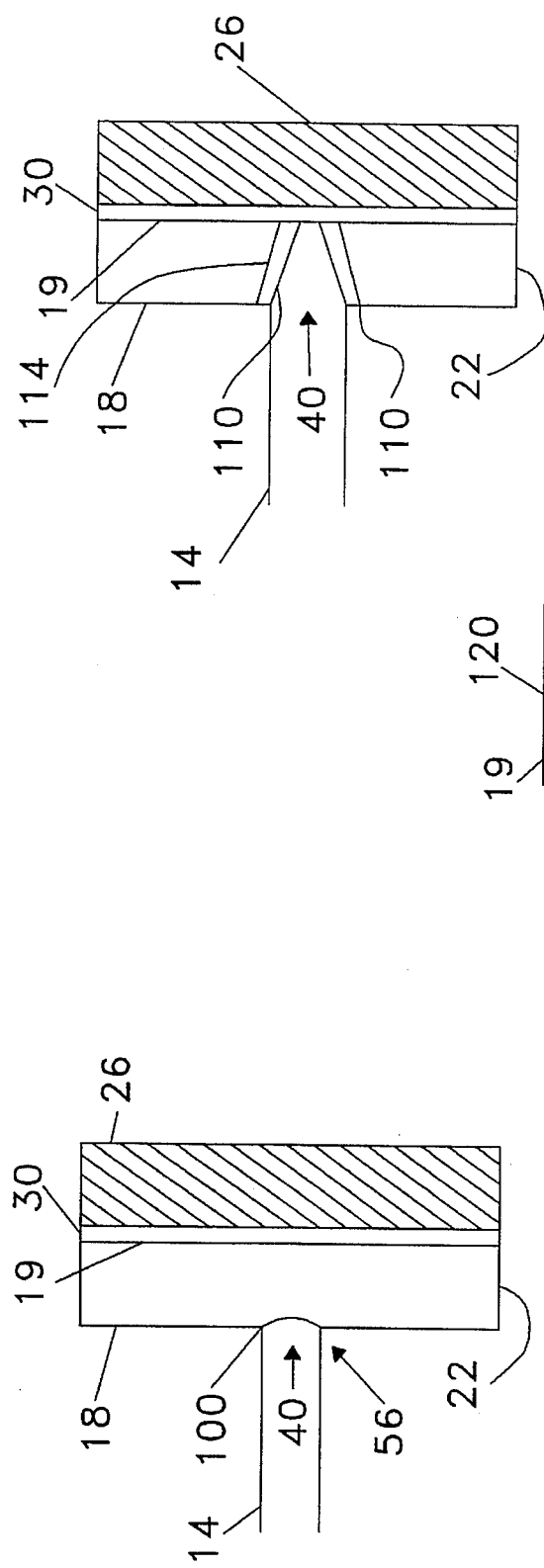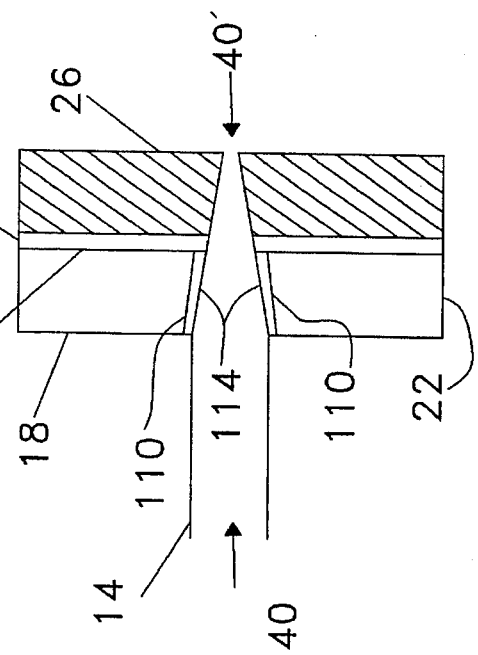

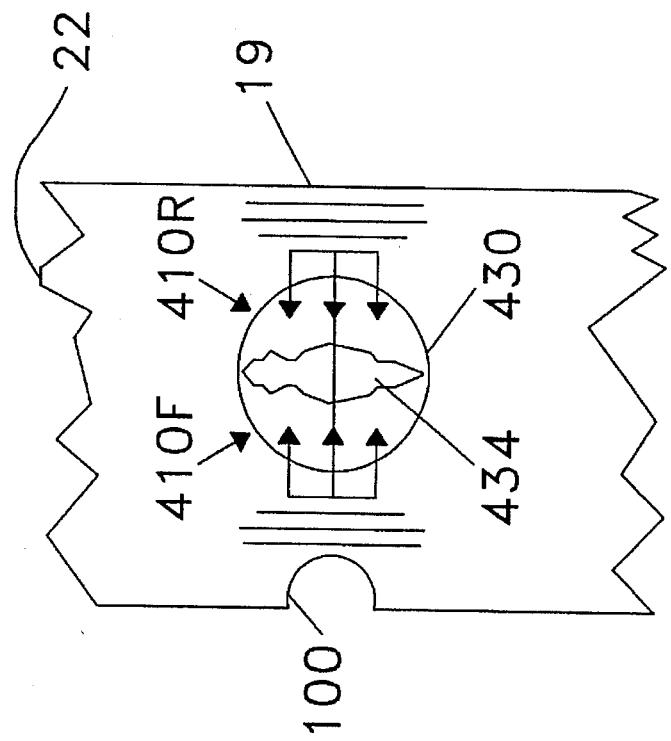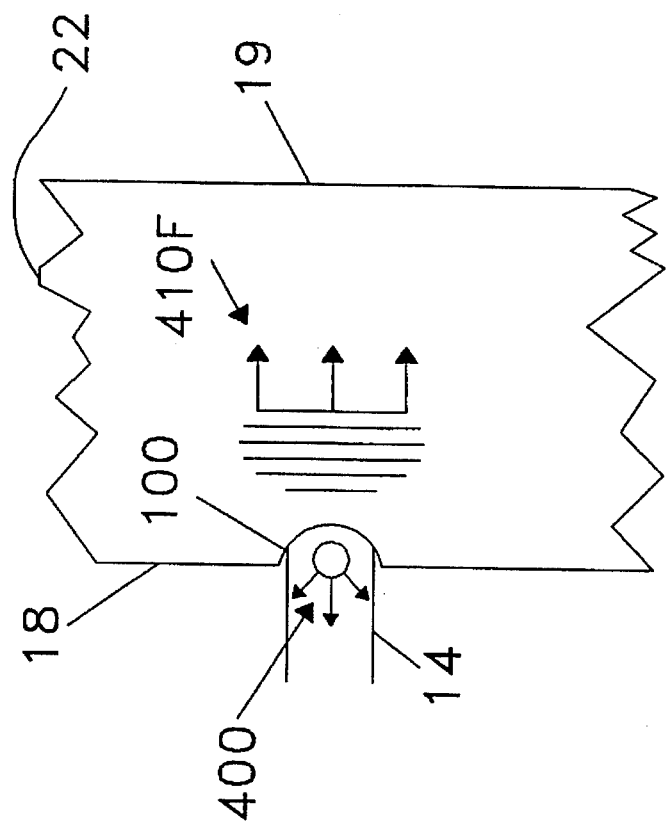

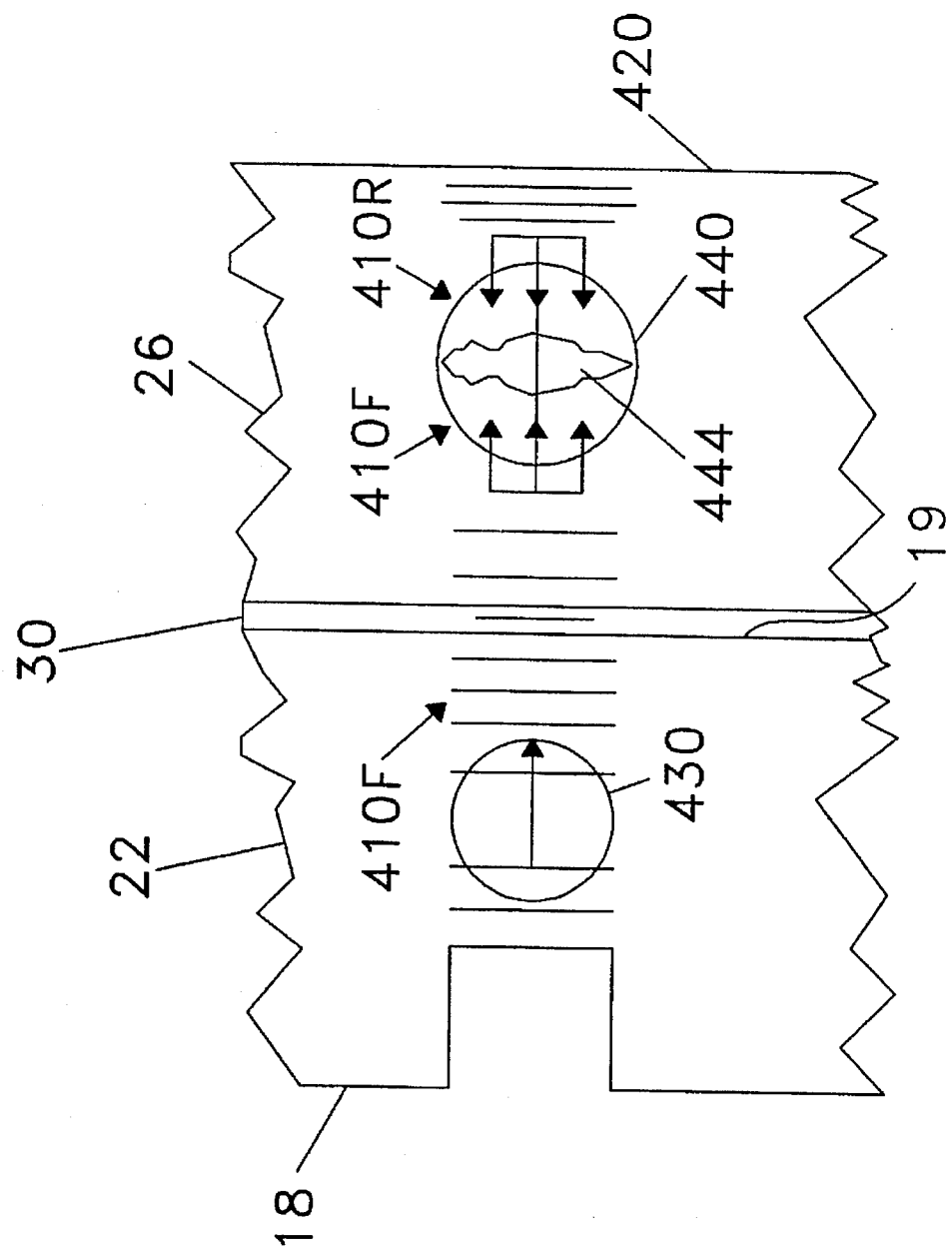

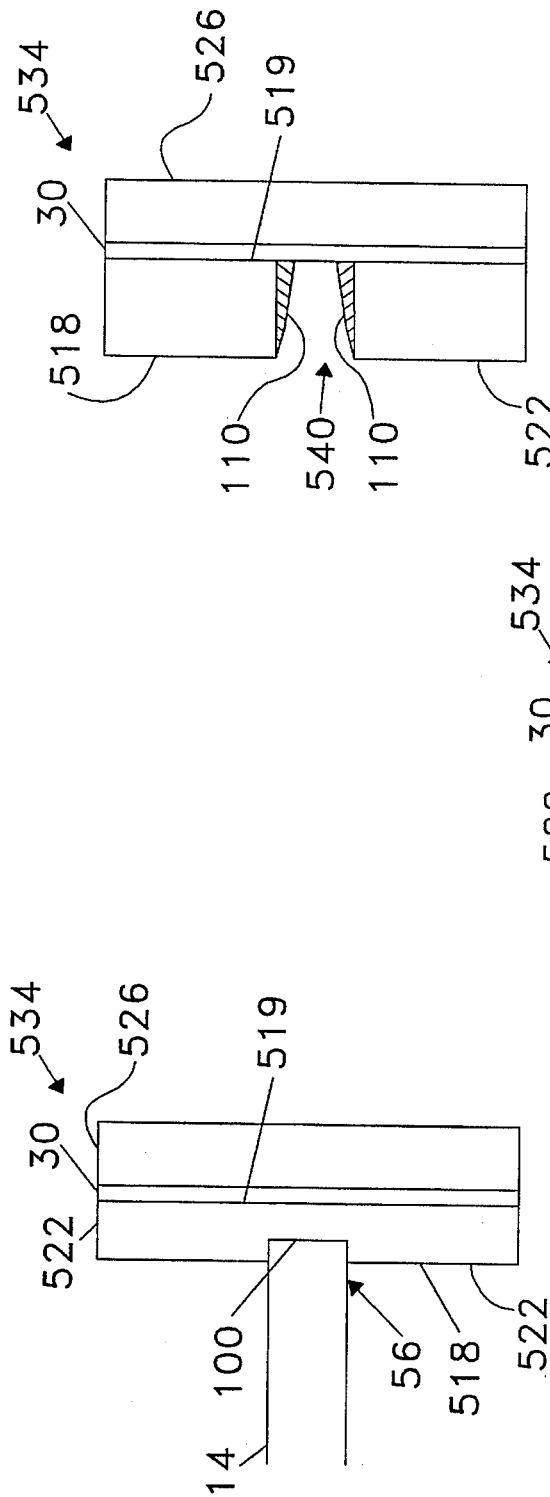
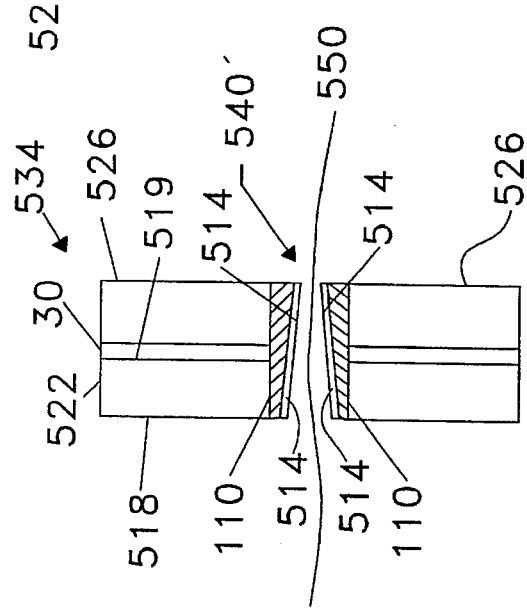
Figure 5a
Figure 5b
Figure 5c 5,584,956

METHOD FOR PRODUCING CONDUCTIVE OR INSULATING FEEDTHROUGHS IN A SUBSTRATE

This application is a continuation of application Ser. No. 07/987,783, filed Dec. 9, 1992, now abandoned.

BACKGROUND OF THE INVENTION

1. Field of the Invention

This invention relates generally to a method for producing conductive or insulating feedthroughs from a front surface of a substrate to a back surface of the substrate, and to the substrate with feedthroughs produced from that method. Such feedthroughs make it possible to interconnect devices on opposite sides of the substrate or to interconnect devices on two different substrates without having to pass a wire around an outer edge of the substrate.

2. Description of Related Art

Components on opposite sides of a single substrate or on two separate substrates in a multilayer integrated circuit must often be interconnected. This can be accomplished by passing a wire from one of the components, around the substrate to the other component. However, since electric signals travel from one point to another at finite speeds, the lengths of interconnections between such components has become an important parameter in determining the final rate of operation of multilayer integrated circuits. It is therefore desirable to provide short interconnections between such devices.

One way to provide shorter interconnections is to fabricate feedthroughs directly in substrates. FIGS. 1a and 1b are examples of two situations in which separate components must be interconnected and the components are on opposite sides of a single substrate and on different substrates, respectively. In particular, Figure 1a shows a substrate 1 with a component 2 on a first surface 3 and a component 4 on a second surface 5 of substrate 1, whereas FIG. 1b shows substrate 1 with component 2 on first surface 3 but with component 4 on a first surface 9 of another substrate 8. In both cases, if substrate 1 has no feedthrough, a wire 6 must be led from component 4 around substrate 1 to component 2 in order to interconnect components 2 and 4. If, on the other hand, substrate 1 does have feedthrough 7, a significantly shorter wire 6' can interconnect devices 2 and 4.

Surfaces 3, 5 and 9 can be conductive or non-conductive and feedthrough 7 can be an insulated feedthrough or a conductive feedthrough. If feedthrough 7 is an insulated feedthrough, then wire 6' is a single piece of wire which is passed (fed) through feedthrough 7. If, however, feedthrough 7 is a conductive feedthrough, then wire 6' is two pieces, one piece being connected to each end of feedthrough 7. Also, instead of using wire 6, conductive paths can be photolithographically fabricated directly onto surfaces 3, 5 or 9.

Another important feature for multiple layer circuitry is the diameter of feedthroughs. Larger diameter feedthroughs waste surface area of a substrate, thereby reducing the number of components which can be supported by the substrate. That is, if feedthroughs are produced by drilling holes into a substrate as described in "Machining of Advanced Ceramics," Laurel M. Sheppard, pp. 40–48, *Advanced Materials and Processes Incorporating Metal Progress*, Dec., 1987, the diameters of resulting drilled holes can be on the order of millimeters. This creates a mismatch between the size of integrated circuit components (typically in micrometers) and the size of the feedthroughs made by drilling holes. Similarly, a mismatch can occur between photolithographically created conductive paths and feedthroughs made by drilling holes. Therefore, it is also desirable to fabricate conductive feedthroughs in a substrate on the order of a few micrometers.

Another important feature for multiple layer circuitry is that it sometimes necessary to interconnect multi-conductor transmission lines (e.g., two conductor microstrip transmission lines) which are on two sides of a single substrate or on separate substrates. Therefore, it is also desirable to fabricate small diameter multi-conductor feedthroughs in a substrate.

SUMMARY OF THE INVENTION

An object therefore is to provide a method for producing small diameter feedthroughs in a substrate, and in particular to provide a method for producing small diameter conductive or insulated feedthroughs and the substrate produced from that method.

Another object is to provide a method for producing a small diameter two conductor feedthrough in a substrate.

An advantage of the method is that it can produce small diameter conductive or insulated feedthroughs. Another advantage of the method is that it can produce multiconductor feedthroughs for feeding signals from one transmission line, through a substrate to another transmission line.

One feature of the invention is that it involves intimately bonding a sheet of material to a back surface of a substrate. Another feature of the invention is that it involves using laser ablation to create holes in a substrate. In particular, the invention involves using a pulsed laser to ablate a region of the substrate and a region of the sheet material. Another feature is that it involves ablating the substrate while that substrate is contained in a controlled atmosphere such as a vacuum cell.

These and other objects, advantages and features are accomplished in accordance with the invention by a method for producing a conductive feedthrough in a substrate having a front and back surface, wherein the substrate absorbs radiation at a given wavelength. The method includes the steps of selecting a metal sheet which is absorptive at the given wavelength and intimately bonding the metal sheet to the back surface of the substrate, and this intimate bonding can be achieved using an adhesive. The method further includes periodically illuminating an area on the front surface of the substrate with laser radiation at the given wavelength and at a power level sufficient to ablate a portion of the substrate and a portion of the metal sheet behind the area. The metal sheet can then be removed from the substrate, thereby producing the conductive feedthrough in the substrate.

The above and other objects, advantages and features are accomplished in accordance with a method for producing an insulated feedthrough in a conductive substrate having a front and back surface, wherein the conductive substrate absorbs radiation at a given wavelength. The method includes selecting an insulator sheet which is absorptive at the given wavelength and intimately bonding the insulator sheet to the back surface of the conductive substrate. The method further includes illuminating an area on the front surface of the conductive substrate with laser radiation at the given wavelength and at a power level sufficient to ablate a portion of the metal substrate and a portion of the insulator sheet behind that area. The insulator sheet can then be removed from the metal substrate, thereby creating the insulated feedthrough in the metal substrate. A wire can then be inserted through the feedthrough and the substrate can be heated until the feedthrough is sealed.

Alternatively, the above and other objects, advantages and features can be accomplished in accordance with a method for producing a feedthrough in a substrate having a front and back surface and a hole. The method includes selecting a sheet which is absorptive at a given wavelength, intimately bonding the sheet to the back surface of the substrate and illuminating an area of the sheet behind the hole with laser radiation at the given wavelength and at a power level sufficient to ablate a portion of the sheet behind the hole, thereby creating the feedthrough in the substrate.

A method for producing a two conductor feedthrough in a first substrate having a front and back surface, wherein said first substrate absorbs radiation at a given wavelength. The method includes selecting a metal sheet which has a front and back surface and which is absorptive at the given wavelength and intimately bonding the front surface of the metal sheet to the back surface of the first substrate. The method further includes selecting a second substrate which has a front and a back surface and is absorptive at the given wavelength, intimately bonding the front surface of the metal sheet to the back surface of the first substrate and intimately bonding the back surface of the metal sheet to the front surface of the second substrate. The method then involves periodically illuminating an area on the front surface of the first substrate with laser radiation at the given wavelength and at a power level sufficient to ablate a portion of the first substrate at the area, a portion of the first substrate behind the area, a portion of the metal sheet behind the area and a portion of the second substrate behind the area. The second substrate can then be removed from the metal sheet and the metal sheet can then be removed from the first substrate, thereby yielding an outer conductor feedthrough. A wire is then inserted through the outer conductor feedthrough, thereby producing the two conductor feedthrough in the first substrate. A dual conductor cable with an inner conductor and an outer conductor can then be connected to the two conductor feedthrough.

BRIEF DESCRIPTION OF THE DRAWINGS

FIGS. 3a, 3b and 3c show various stages of the conductive feedthrough forming process.

FIGS. 4a, 4b and 4c show how shock waves generated during ablation can cause a substrate fracture.

FIGS. 5a, 5b and 5c show an insulated feedthrough forming process corresponding to FIGS. 3a, 3b and 3c, respectively, with thin metal sheet 26 replaced by an insulator sheet 526 and substrate 22 replaced by conductive substrate 522 according to another embodiment of the invention.

DETAILED DESCRIPTION OF THE PREFERRED EMBODIMENTS

Figure 1A:
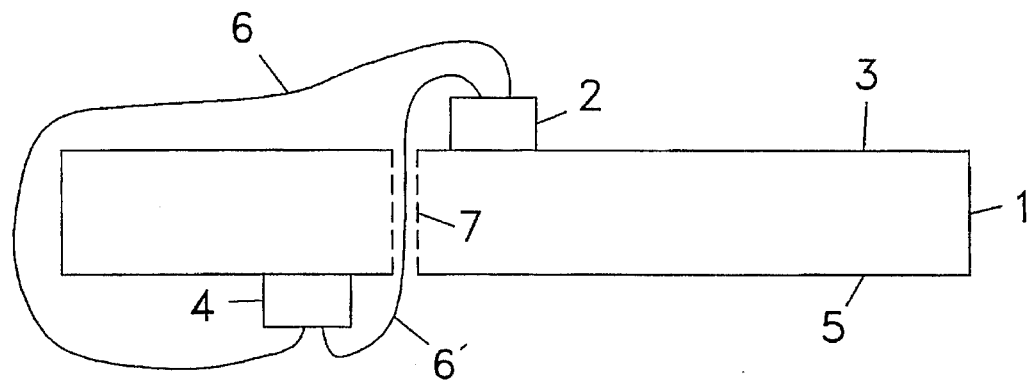
FIG. 1a and 1b are examples of a situation in which components are on two sides of a single substrate and on two different substrates, respectively.
Figure 1B:
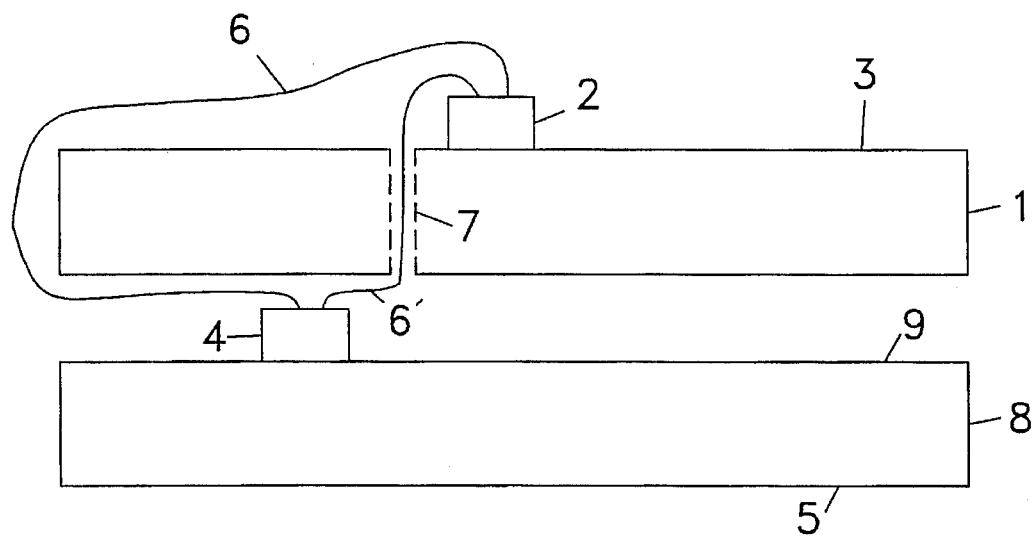
Figure 2A:
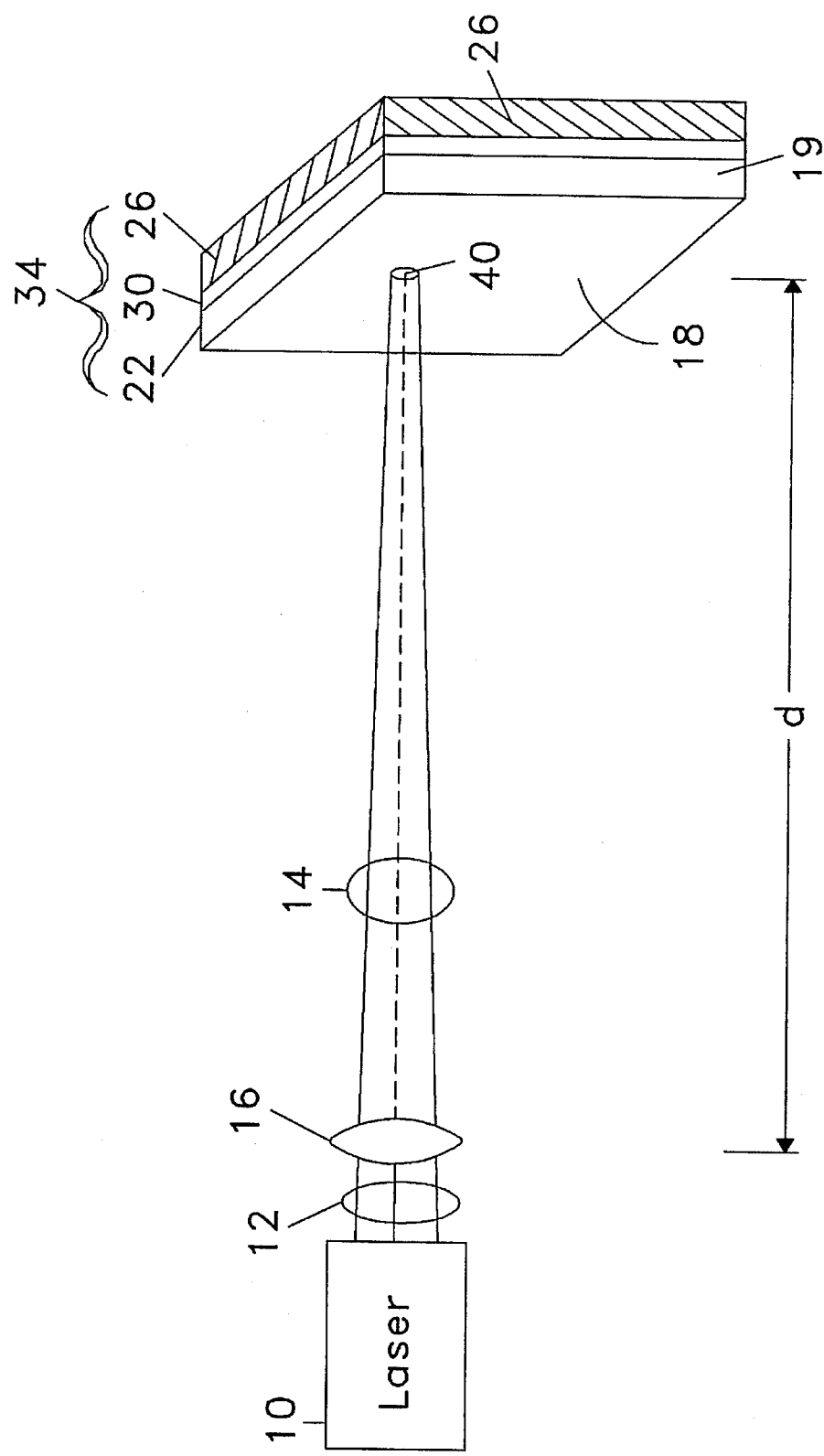
FIGS. 2a, 2b and 2c show a laser with a substrate according to one embodiment of the invention, a laser with a substrate in a vacuum cell according to another embodiment of the invention and a front view of the substrate, respectively.

FIG. 2a shows a laser 10 outputting laser radiation 12 formed into a laser beam 14 using a lens 16 of focal length f according to one embodiment of the invention. Lens 16 is placed a distance d away from front substrate surface 18 of substrate 22, where d can range from a few centimeters to meters. Substrate 22 can be an insulator, a semiconductor or even a metal and can have a thickness from approximately a fraction of a millimeter such as 0.5 mm up to several millimeters depending on whether or not substrate 22 already has a hole from which a feedthrough can be formed. A thin metal sheet 26 is adhesively bonded to a back substrate surface 19 of substrate 22 with an adhesive layer 30. Thin metal sheet 26 can have a thickness of approximately 0.1 mm to 0.5 mm depending on the absorptivity of laser beam 14 by thin metal sheet 26 and the amount of metal to be deposited in the hole. The combination of substrate 22, adhesive layer 30 (if any) and thin metal sheet 26 will be referred to hereinafter as substrate-metal sheet 34.

Conductive feedthroughs are formed in substrate 22 by an ablation process. That is, laser beam 14 first ablates substrate 22, then adhesive layer 30 followed by thin metal sheet 26 thereby creating a conductive feedthrough 40. Laser 10 is typically pulsed and its wavelength is chosen so that laser radiation 12 is highly absorbed by substrate 22 and thin metal sheet 26. Once feedthrough 40 is formed, an adhesive dissolving solution such as acetone can be used to dissolve adhesive layer 30. Thin metal sheet 26 can be peeled away from back substrate surface 19 or left in place.

Figure 2B:
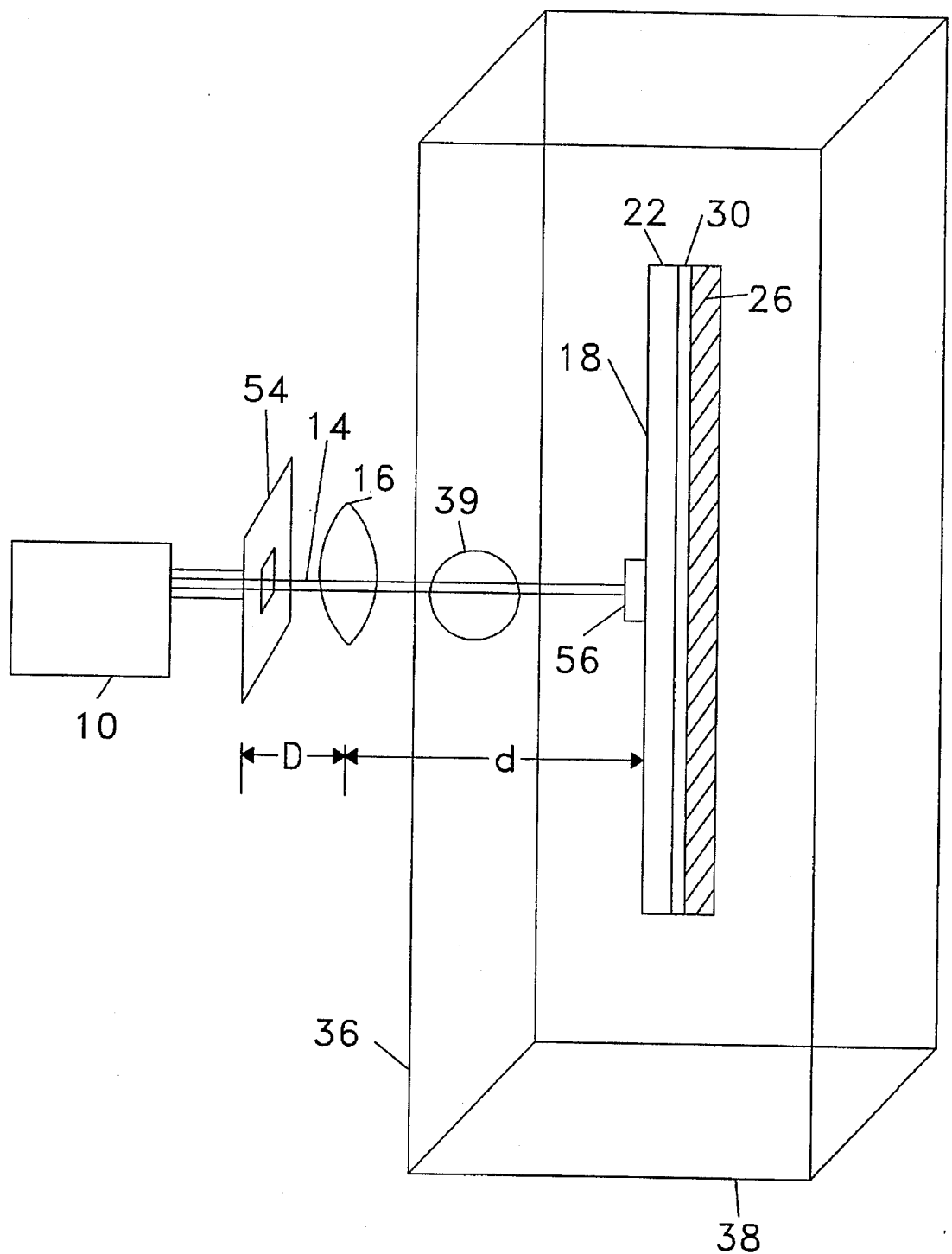
Figure 2C:
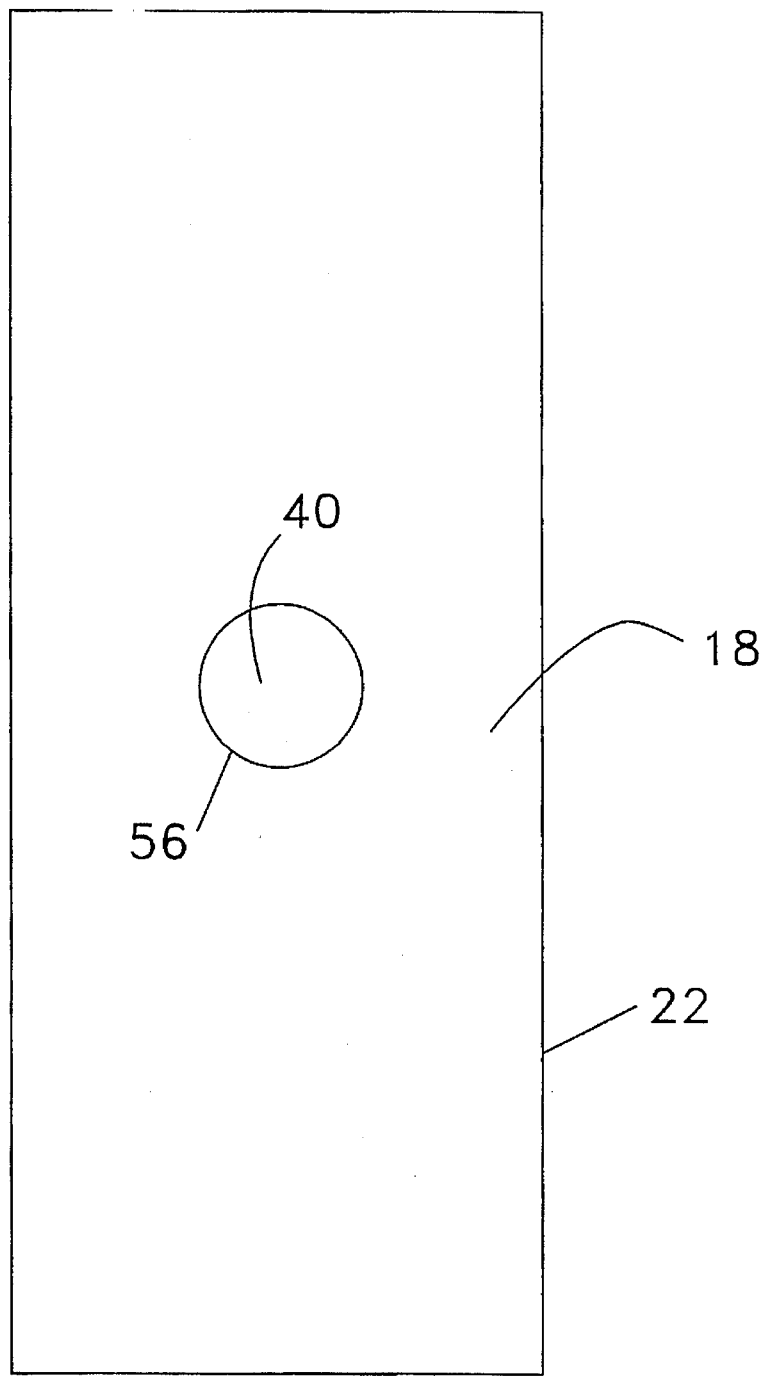

FIGS. 2b and 2c show a side and a front view, respectively, of substrate 22 with adhesive layer 30 and thin metal sheet 26. Substrate-metal sheet 34 can be placed in a vacuum cell 38 with a window 39 which transmits beam 14. An aperture 54 can be used to control the shape of an area 56 on substrate surface 18 exposed to laser beam 14. That is, if aperture 54 is placed a distance D from lens 16, the shape of aperture 54 is imaged onto substrate surface 18 as area 56, provided the distances D and d satisfy the lens maker's equation $1/o+1/i=1/f$, where o is the object distance (here o=D), i is the image distance (here i=d) and f is the focal length of lens 16. This equation must be satisfied whether or not vacuum cell 38 is used. Furthermore, the magnification M of aperture 54 is the ratio i/o and hence, here the magnification is d/D. Consequently, the distance d can be varied provided D is chosen so that d and D together satisfy the lens equation. Once the magnification is known, it is possible to determine the average energy per unit area of laser radiation 12 exposing area 56 on substrate surface 18. This, in turn, can be used to determine the power level (pulse energy and duration) required to ablate a unit thickness of substrate material from substrate 22 and metal material from metal 26.

FIGS. 3a, 3b and 3c show various stages of the conductive feedthrough forming process. FIG. 3a shows an initial stage of the process in which laser beam 14 begins to ablate substrate surface 18 creating an initial substrate indentation 100 at area 56. Laser 10 can be pulsed or operated continuously to produce a high laser radiation energy per unit area (energy density) per unit time (or power per unit area) on substrate surface 18. Laser beam 14 ablates substrate 22 because the power per unit area on substrate surface 18 is sufficiently high (exceeds a damage threshold), and the frequency of laser radiation 12 was chosen so that laser radiation 12 is highly absorbed by substrate 22. Here, the damage threshold of a material is defined to be the minimum energy density required to effect an observable change in surface structure of the material. The damage threshold can be determined by illuminating the surface of the material with radiation having known energy densities (the radiation being at a wavelength which is absorbed by the material), and observing the surface structure of the material before and after this illumination. The energy density which brings about the first observable change in surface structure is defined here as the damage threshold.

FIG. 3b shows the process after laser beam 14 has penetrated through substrate 22 and adhesive layer 30. A coating 110 is formed in hole 40. Coating 110 includes primarily ablated substrate material from substrate 22 and possibly a trace of residue from adhesive layer 30, if present. Coating 110 causes hole 40 to be slightly tapered because the ablated substrate material cannot escape from substrate 22 quite as readily as hole 40 becomes deeper. Hence, the relative thickness of substrate 22 with respect to the beam diameter 14 determines how small the average diameter of hole 40 can be made.

FIG. 3c shows the process after laser beam 14 has penetrated through thin metal sheet 26 leaving a metal coating 114 on coating 110. As can be seen, metal coating 114 covers coating 110 and provides a conductive path from front substrate surface 18 to back substrate surface 19, thereby forming conductive feedthrough 40' from hole 40.

The adhesive material used for adhesive layer 30 must be capable of forming an intimate bond with back substrate surface 19, i.e., it must be capable of forming a bond with no porosity or voids. Otherwise, shock waves generated during ablation of substrate 22 cause substrate 22 to fracture as will be discussed below with reference to FIGS. 4a–4c. An intimate bond may be achieved without adhesive layer 30 by laminating substrate 22 and sheet 26 together, depositing the material which makes up sheet 26 onto back substrate surface 19 of substrate 22, or possibly using a coextrusion process.

Referring to FIG. 4a, laser radiation 12 in laser beam 14 vaporizes a portion of substrate 22 causing a very dense volume of ablated material 400 to form in indentation 100. Here, substrate 22 does not have a metal sheet 26. This dense material undergoes a sudden expansion when it first exits from substrate 22 thereby launching forward travelling shock waves 410F (left to right in FIG. 4a) in substrate 22. Shock waves 410F travel to back substrate surface 19 and are in turn reflected back towards front substrate surface 18 as reflected shock waves 410R.

FIG. 4b shows reflected shock waves 410R travelling away from back substrate surface 19 (right to left in FIG. 4b). Again, no metal sheet 26 is adhered to substrate 22. Reflected travelling shock waves 410R necessarily interfere with forward travelling shock waves 410F causing fractures or craters 434 to form in region 430. The width of such craters can generally be larger than the diameter of indentation 100. This can be avoided by intimately bonding thin metal sheet 26 to substrate 22 as will be discussed below.

FIG. 4c shows substrate-metal sheet 34 with adhesive layer 30 forming an intimate bond between substrate 22 and thin metal sheet 26. Here, adhesive layer 30 allows shock waves 410F to pass to thin metal sheet 26 which in turn are reflected at back metal sheet surface 420 back towards back substrate surface 19. This time however, forward travelling shock waves 410F interfere with reflected shock waves 410R in region 440 of thin metal sheet 26. Metal sheet 26 can have fractures 444 form in region 440. However, metal sheet 26 is eventually removed from substrate 22 leaving substrate 22 with conductive feedthrough 40 and no fractures or craters.

EXAMPLE

In one example, substrate 22 was selected to be a 0.025 inch thick sheet of aluminum nitride, thin metal sheet 26 was selected to be a 0.010 inch thick sheet of aluminum and adhesive layer 30 was selected to be a cyanoacrylate adhesive (e.g., Crazy Glue). In this case, laser 10 was selected to be a krypton fluoride (KrF) excimer laser with an operating wavelength of about 248 nm and 34 nanosecond pulse length. An example of such an excimer laser is the Lambda Physik LPX 210icc. Vacuum cell 38 was made of stainless steel and had a window 39 made of quartz. Vacuum cell 38 was evacuated to a pressure of $10^{-5}$ Torr. A camera aperture was used as aperture 54 creating an approximately circular area 56. Lens 16 was arranged a distance D from aperture 54 and d from substrate-metal sheet 34 to yield a power of about 50 Joules/cm$^2$ incident on area 56. The damage threshold for aluminum nitride was measured in the manner described above to be about 1 Joule/cm$^2$. Aluminum has a damage threshold of about 10 Joules/cm$^2$ for radiation at 248 nm. Approximately 3000 pulses at 50 J/cm$^2$ for each hole were needed to penetrate the 0.025 inch thick aluminum nitride substrate 22 and begin ablation of metal sheet 26. Several shallow holes 40 were drilled into metal sheet 26 each requiring about 50 pulses from laser 10. Resulting feedthroughs 40' were measured to have resistances of less than 0.5 ohms per feedthrough.

FIGS. 5a, 5b and 5c show an insulated feedthrough forming process corresponding to FIGS. 3a, 3b and 3c, respectively. Here, thin metal sheet 26 replaced by an insulator sheet 526 and substrate 22 replaced by conductive substrate 522 according to another embodiment of the invention. Also, substrate 522 can be a conductive metal sheet or a semiconductor. In addition, substrate 522 need not be conductive at all times and can instead be conductive part of the time depending, for example, on ambient temperature.

FIG. 5a shows an initial stage of the process in which laser beam 14 begins to ablate substrate surface 18 creating an initial substrate indentation 100 at area 56. Insulator sheet 526 is intimately bonded to substrate 522 with or without adhesive layer 30 as before. The combination of substrate 522, adhesive layer 30 and insulator sheet 526 is referred to here as substrate-insulator sheet 534. Laser beam 14 again ablates substrate 522 first, then adhesive layer 30 followed by insulator sheet 526 thereby creating a feedthrough 540.

Laser 10 is again pulsed and its wavelength is chosen so that laser radiation 12 is highly absorbed by substrate 522, adhesive layer 30 and insulator sheet 526. Laser beam 14 ablates substrate 522 because the frequency of laser radiation 12 was again chosen to be highly absorbed by substrate 522 in a manner identical to that described above using thin metal sheet 526.

FIG. 5b shows the process after laser beam 14 has penetrated through substrate 522 and adhesive layer 30 leaving coating 110 in an inner wall of insulated feedthrough 540. Coating 110 includes ablated substrate material from substrate 522 and a small amount of adhesive from adhesive layer 30.

FIG. 5c shows the process after laser beam 14 has penetrated through insulator sheet 526 leaving an insulator coating 514 on coating 110. Insulator coating 514 provides an insulated guide through which a wire 550 can be passed. Hence, feedthrough 540' can serve as a feedthrough for wire 550 to connect some point on front substrate surface 518 to some point on back substrate surface 519. Insulator coating 514 can then be locally heated so that insulator coating 514 begins to melt thereby sealing wire 550 in feedthrough 540'.

FIGS. 6a, 6b, 6c and 6d show various steps of an ablation process for producing a two conductor feedthrough according to another embodiment of the invention. Here, a first substrate 622A is adhesively bonded to a metal layer 626 by a first adhesive layer 630A. Metal layer 626 is in turn bonded to a second substrate 622B by a second adhesive layer 630B. First and second substrates 622A and 622B, adhesive layers 630A and 630B and metal layer 626 should have the same properties as above discussed substrate 22, adhesive layer 30 and thin metal sheet 26, respectively such as they should absorb laser radiation 12 in laser beam 14.

Figure 6B:
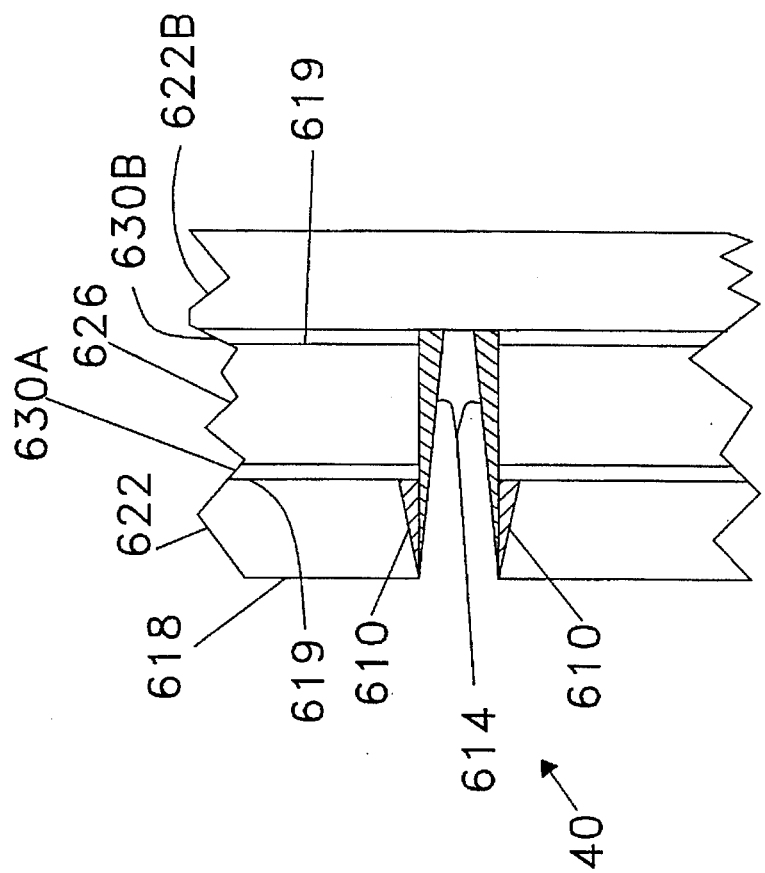
FIGS. 6a, 6b, 6c and 6d show various steps of an ablation process for producing a two conductor feedthrough according to another embodiment of the invention.
Figure 6A:
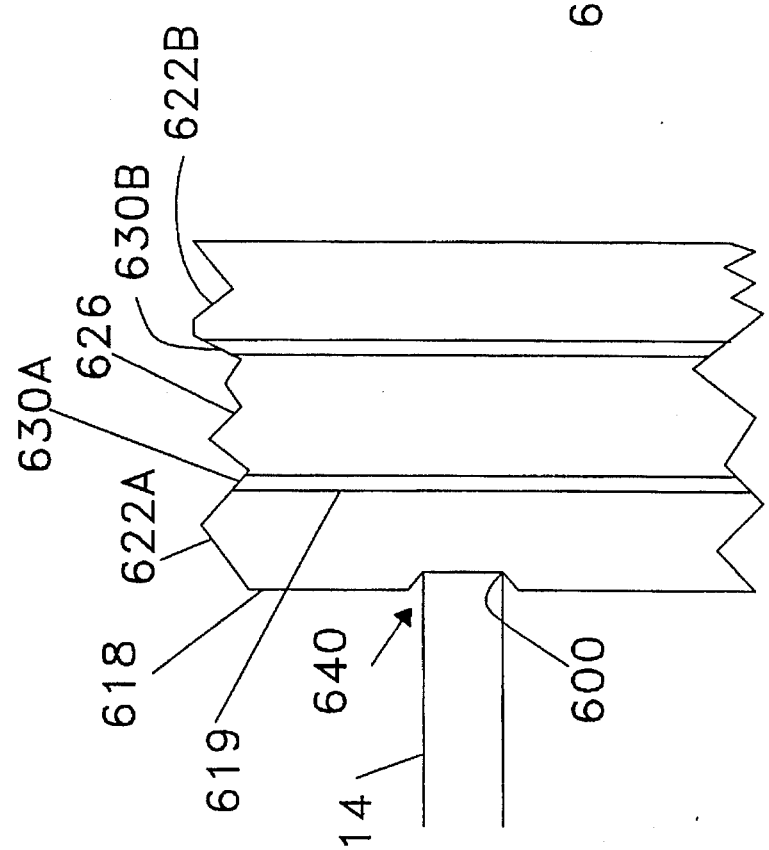

FIG. 6a shows an initial stage of the process in which laser beam 14 begins to ablate front substrate surface 618 creating an initial substrate indentation 600 similar to indentation 100 above.

FIG. 6b shows a laser beam 14 having ablated first substrate 622A until laser beam 14 penetrates through metal layer 626. In particular, laser beam 14 ablates and passes through adhesive layer 630A leaving a coating 610 in the inner wall of hole 640. Coating 610 includes ablated substrate material from first substrate 622A and residue from 630A. Laser beam 14 continues on to ablate metal layer 626 leaving a metal coating 614 over coating 610 and in the inner wall of hole 640. Metal coating 614 provides a conductive path from front substrate surface 618 to back substrate surface 619 (see also FIG. 6d).

Figure 6D:
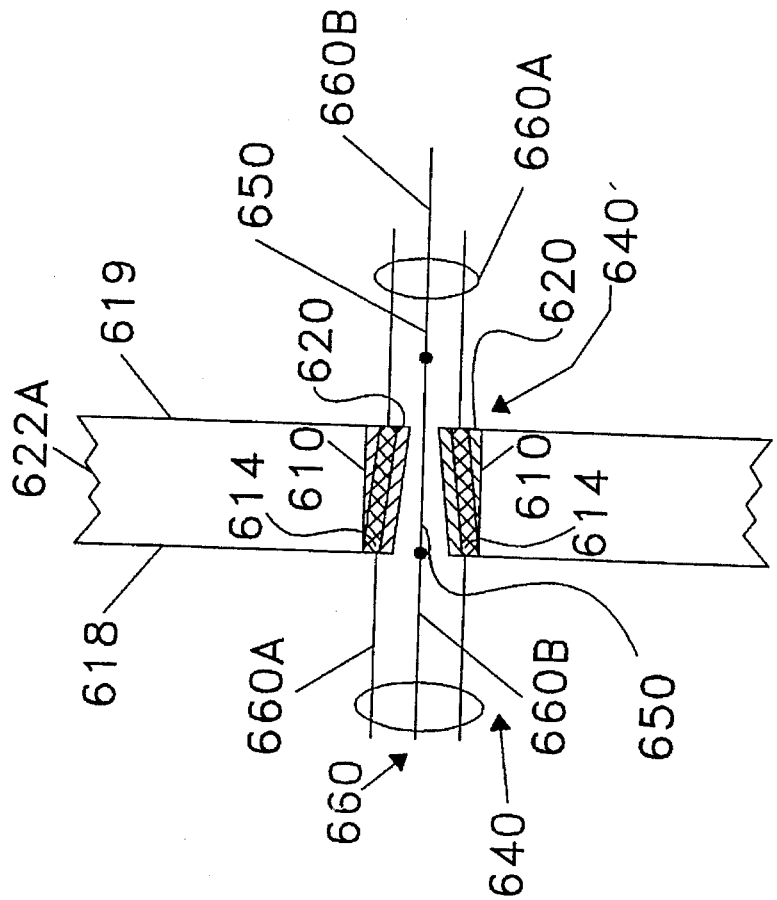
Figure 6C:
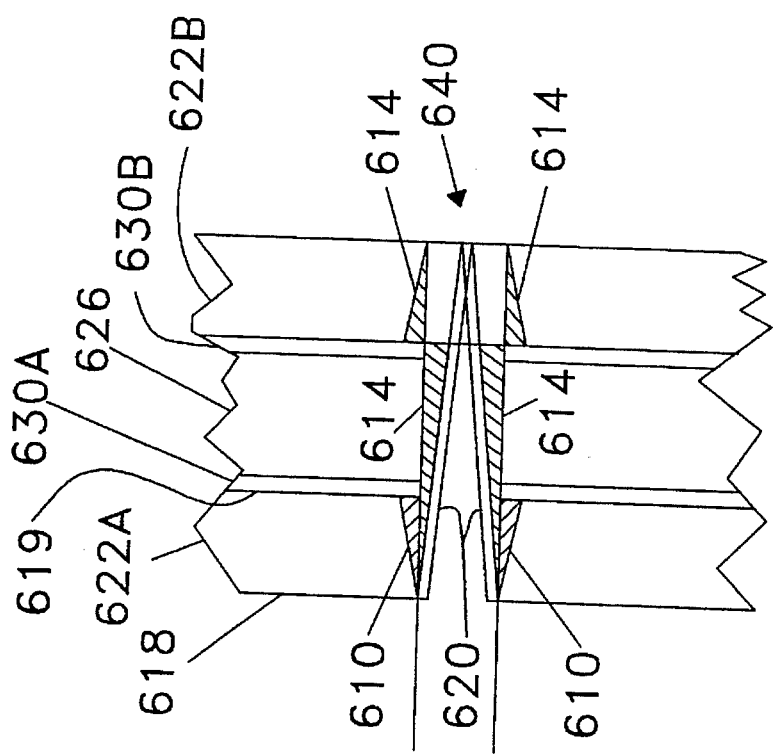

FIG. 6c shows the process after laser beam 14 has penetrated through second substrate 622B leaving an insulator coating 620 over metal coating 614. Second substrate 622B is removed from metal layer 626 in the same manner as described above. Then, metal layer 626 is removed from first substrate 622A.

FIG. 6d shows how an inner wire 650 can then be passed through hole 640 to yield a two conductor feedthrough 640' which can be used to feed a coaxial cable 660 from front surface 618 to back substrate surface 619. Outer conductor 660A of coaxial cable 660 can be connected to metal coating 614 and inner conductor 660B can be connected to wire 650, thereby completing a two connector feedthrough from front substrate surface 618 to back substrate surface 619 of first substrate 622A. If the melting point of insulator layer 610 is above that of insulator coating 620, insulator coating 620 can be heated until it begins to melt, thereby sealing wire 650 while maintaining feedthrough 640' intact. The melting point of wire 650 and metal coating 614 must be above the melting point of insulator coating 620.

Obviously, numerous and additional modifications and variations of the present invention are possible in light of the above teachings. It is therefore to be understood that within the scope of the appended claims, the invention may be practiced otherwise than as specifically claimed.

What is claimed is:

1. A method for producing a feedthrough in a substrate having a front and back surface, wherein said substrate absorbs radiation at a given wavelength, comprising the steps of:
    selecting a sheet which is absorptive at said given wavelength and has a thickness;
    intimately bonding said sheet to said back surface of the substrate; and
    illuminating an area on said front surface of the substrate with laser radiation at said given wavelength at a power level sufficient to ablate a portion of said substrate, thereby creating an opening in said substrate and to ablate a volume of said sheet behind said area, thereby creating said feedthrough in the substrate, wherein said intimately bonding step includes intimately bonding said sheet to said back surface of the substrate in a manner free of porosity and voids such that shock waves created in the substrate due to said illuminating step pass to said sheet and said thickness of the sheet is sufficiently great that said shockwaves are dissipated in said sheet, thereby avoiding fractures in said substrate, wherein said selecting step comprises selecting a sheet having a thickness of at least 0.1 mm.

2. A method for producing a feedthrough in a substrate having a front and back surface, wherein said substrate absorbs radiation at a given wavelength, comprising the steps of:
    selecting a sheet which is absorptive at said given wavelength and has a thickness;
    intimately bonding said sheet to said back surface of the substrate; and
    illuminating an area on said front surface of the substrate with laser radiation at said given wavelength at a power level sufficient to ablate a portion of said substrate, thereby creating an opening in said substrate and to ablate a volume of said sheet behind said area, thereby creating said feedthrough in the substrate, wherein said intimately bonding step includes intimately bonding said sheet to said back surface of the substrate in a manner free of porosity and voids such that shock waves created in the substrate due to said illuminating step pass to said sheet and said thickness of the sheet is sufficiently great that said shockwaves are dissipated in said sheet, thereby avoiding fractures in said substrate, wherein said selecting step comprises selecting a sheet having a thickness of approximately 0.1 mm to 0.5 mm.

3. A method for producing a feedthrough in a substrate having a front and back surface, wherein said substrate absorbs radiation at a given wavelength, comprising the steps of:
    selecting a sheet which is absorptive at said given wavelength and has a thickness;
    intimately bonding said sheet to said back surface of the substrate; and
    illuminating an area on said front surface of the substrate with laser radiation at said given wavelength at a power level sufficient to ablate a portion of said substrate, thereby creating an opening in said substrate and to ablate a volume of said sheet behind said area, thereby creating said feedthrough in the substrate, wherein said intimately bonding step includes intimately bonding said sheet to said back surface of the substrate in a manner free of porosity and voids such that shock waves created in the substrate due to said illuminating step pass to said sheet and said thickness of the sheet is sufficiently great that said shockwaves are dissipated in said sheet, thereby avoiding fractures in said substrate, wherein said intimately bonding step comprises laminating said sheet to said substrate and wherein said selecting step comprises selecting a sheet having a thickness of at least 0.1 mm.

4. A method for producing a feedthrough in a substrate having a front and back surface, wherein said substrate absorbs radiation at a given wavelength, comprising the steps of:
    depositing a sheet of material which is absorptive at said given wavelength and has a thickness, to said back surface of the substrate; and
    illuminating an area on said front surface of the substrate with laser radiation at said given wavelength at a power level sufficient to ablate a portion of said substrate, thereby creating an opening in said substrate and to ablate a volume of said sheet of material behind said area, thereby creating said feedthrough in the substrate, wherein said intimately bonding step includes intimately bonding said sheet of material to said back surface of the substrate in a manner free of porosity and voids such that shock waves created in the substrate due to said illuminating step pass to said sheet of material and said thickness of the sheet of material is sufficiently great that said shockwaves are dissipated in said sheet of material, thereby avoiding fractures in said substrate, wherein said depositing step comprises depositing a sheet of material having a thickness of at least 0.1 mm.

5. A method for producing a feedthrough in a substrate having a front and back surface, wherein said substrate absorbs radiation at a given wavelength, comprising the steps of:

selecting a sheet which is absorptive at said given wavelength and has a thickness;

intimately bonding said sheet to said back surface of the substrate; and illuminating an area on said front surface of the substrate with laser radiation at said given wavelength at a power level sufficient to ablate a portion of said substrate, thereby creating an opening in said substrate and to ablate a volume of said sheet behind said area, thereby creating said feedthrough in the substrate, wherein said selecting step involves selecting an electrical insulator sheet, said feedthrough thereby becoming an insulated feedthrough, and wherein said intimately bonding step includes intimately bonding said sheet to said back surface of the substrate in a manner free of porosity and voids such that shock waves created in the substrate due to said illuminating step pass to said sheet and said thickness of the sheet is sufficiently great that said shock waves are dissipated in said sheet, thereby avoiding fractures in said substrate.

6. A method for producing a feedthrough in a substrate having a front and back surface, wherein said substrate absorbs radiation at a given wavelength, comprising the steps of:

selecting a sheet which is absorptive at said given wavelength and has a thickness;

intimately bonding said sheet to said back surface of the substrate;

illuminating an area on said front surface of the substrate with laser radiation at said given wavelength at a power level sufficient to ablate a portion of said substrate, thereby creating an opening in said substrate and to ablate a volume of said sheet behind said area, thereby creating said feedthrough in the substrate, and wherein said intimately bonding step includes intimately bonding said sheet to said back surface of the substrate in a manner free of porosity and voids such that shock waves created in the substrate due to said illuminating step pass to said sheet and said thickness of the sheet is sufficiently great that said shock waves are dissipated in said sheet, thereby avoiding fractures in said substrate; and removing said sheet from said substrate.

7. A method for producing a feedthrough in a substrate having a front and back surface, wherein said substrate absorbs radiation at a given wavelength, comprising the steps of:

selecting a sheet which is absorptive at said given wavelength and has a thickness;

intimately bonding said sheet to said back surface of the substrate;

illuminating an area on said front surface of the substrate with laser radiation at said given wavelength at a power level sufficient to ablate a portion of said substrate, thereby creating an opening in said substrate and to ablate a volume of said sheet behind said area, thereby creating said feedthrough in the substrate, wherein said selecting step involves selecting an electrical conductive sheet, said feedthrough thereby becoming a conductive feedthrough, and wherein said intimately bonding step includes intimately bonding said sheet to said back surface of the substrate in a manner free of porosity and voids such that shock waves created in the substrate due to said illuminating step pass to said sheet and said thickness of the sheet is sufficiently great that said shock waves are dissipated in said sheet, thereby avoiding fractures in said substrate; and removing said sheet from said substrate.

8. The method as claimed in claim 7, further comprising the steps of:

inserting a wire in said feedthrough; and heating said substrate until said wire is sealed in said feedthrough.

9. A method for producing a two conductor feedthrough in a first substrate having a front and back surface, wherein said first substrate absorbs radiation at a given wavelength, comprising the steps of:

selecting a metal sheet which has a front and a back surface and is absorptive at said given wavelength and has a thickness;

intimately bonding said front surface of the metal sheet to said back surface of the first substrate;

selecting a second substrate which has a front and a back surface and is absorptive at said given wavelength;

intimately bonding said back surface of the metal sheet to said front surface of the second substrate;

illuminating an area on said front surface of the first substrate with laser radiation at said given wavelength and at a power level sufficient to ablate a portion of said first substrate at said area, thereby creating an opening in said first substrate, to ablate a portion of said metal sheet behind said area, thereby creating an opening in said metal sheet, and a volume of said second substrate behind said area, wherein said step of intimately bonding said front surface of the metal sheet includes intimately bonding said front surface of the metal sheet to said back surface of the first substrate in a manner free of porosity and voids such that shock waves created in the first substrate due to said illuminating step pass to said metal sheet and said thickness of the sheet is sufficiently great that said shock waves are dissipated in said sheet, thereby avoiding fractures in said first substrate, and said step of intimately bonding said back surface of the metal sheet includes intimately bonding said back surface of the metal sheet to said front surface of the second substrate in a manner free of porosity and voids such that shock waves created in the second substrate due to said illuminating step pass to said metal sheet and said thickness of the sheet is sufficiently great that said shock waves are dissipated in said sheet, thereby avoiding fractures in said second substrate;

removing said second substrate from said metal sheet and said metal sheet from said first substrate, thereby yielding an outer conductor feedthrough; and inserting a wire through said outer conductor feedthrough, thereby producing said two conductor feedthrough in the first substrate.

10. The method as claimed in claim 9, further comprising the step of attaching a dual conductor cable with an inner conductor and an outer conductor to said two conductor feedthrough.

11. The method as claimed in claim 9, wherein said illuminating step involves illuminating an area on said front surface of the first substrate while said first substrate, said metal sheet and said second substrate are in a vacuum cell.

12. A substrate having at least one feedthrough fabricated according to the method of claim 9.

* * * * *